United States Patent
Tanaka et al.

[19]

[11] Patent Number: 5,880,617
[45] Date of Patent: Mar. 9, 1999

[54] LEVEL CONVERSION CIRCUIT AND SEMICONDUCTOR INTEGRATED CIRCUIT

[75] Inventors: Yasunori Tanaka; Hiroaki Suzuki, both of Tokyo, Japan

[73] Assignee: Kabushiki Kaisha Toshiba, Kawasaki, Japan

[21] Appl. No.: 818,624

[22] Filed: Mar. 14, 1997

[30] Foreign Application Priority Data

Mar. 18, 1996 [JP] Japan ..................................... 8-061091

[51] Int. Cl.⁶ .................................................. H03K 19/017
[52] U.S. Cl. ........................... 327/333; 327/55; 327/215; 327/434; 326/80; 326/81
[58] Field of Search .................................. 327/333, 434, 327/437, 536, 55, 215; 326/68, 80, 81

[56] References Cited

U.S. PATENT DOCUMENTS

| | | | |
|---|---|---|---|
| 4,103,190 | 7/1978 | Beutler | 307/362 |
| 5,300,832 | 4/1994 | Roger | 326/57 |
| 5,436,585 | 7/1995 | DiMarco | 327/333 |
| 5,534,798 | 7/1996 | Phillips et al. | 326/108 |
| 5,619,150 | 4/1997 | Briner | 327/55 |

FOREIGN PATENT DOCUMENTS 4-150411  5/1992  Japan .

*Primary Examiner*—Tim Callahan
*Assistant Examiner*—An T. Luu
*Attorney, Agent, or Firm*—Foley & Lardner

[57] ABSTRACT

A level conversion circuit comprises a first CMOS circuit connected between a high voltage (5 V: VDD) power supply and ground to receive an input signal IN1 having an amplitude between a low voltage (3 V: VCC) and a ground voltage (0 V), a second CMOS circuit connected between the 5 V power supply and ground to output an output signal OUT1 having an amplitude between 5 V and 0 V, and first and second intermediate circuits cross-connected between the first and second CMOS circuits. All MOS transistors constituting these circuits have the gate oxide films whose allowable breakdown voltage is lower than 5 V and higher than 3 V.

20 Claims, 8 Drawing Sheets

LEVEL CONVERSION CIRCUIT AND SEMICONDUCTOR INTEGRATED CIRCUIT

BACKGROUND OF THE INVENTION

1. Field of the Invention

The present invention relates to a level conversion circuit capable of functioning as an interface between digital circuits having different power-supply voltages and a semiconductor integrated circuit in which the level conversion circuit is incorporated.

2. Description of the Prior Art

An allowable breakdown voltage of a gate oxide film has been lowered as the process for manufacturing MOS transistors is miniaturized. The breakdown voltage is about 4 V in miniaturized process of about 0.6 $\mu$m. No trouble is caused if the gate oxide film is applied to circuits which are driven by the 3.3 V power supply, but the gate oxide film cannot be used in ordinary logical circuits driven by the 5 V power supply which has been used popularly in the prior art. Accordingly, the semiconductor integrated circuit including the gate oxide film whose breakdown voltage is lower than 5 V cannot help being driven by an around 3.3 V power supply.

In the event that a combination of 3.3 V power-supply system integrated circuits and 5 V power-supply system integrated circuits is used, signal transmission from the low voltage power-supply system to the high voltage power-supply system has not been easy. In the prior art, level conversion of the signal transmitted from the low voltage power-supply system to the high voltage power-supply system has been accomplished by virtue of the following techniques.

FIG. 1 is a circuit diagram showing a configuration of an ordinary level conversion circuit in the prior art (first conventional circuit).

As shown in FIG. 1, this level conversion circuit comprises two stage CMOS circuits which are connected between the 5 V power supply (VDD) and ground. A first stage CMOS circuit consists of a P-channel MOS transistor (referred simply to as "P-MOS" hereinafter) 101 and an N-channel MOS transistor (referred simply to as "N-MOS" hereinafter) 102. A second stage CMOS circuit consists of a P-MOS 103 and an N-MOS 104.

The N-MOS 102 is turned ON if an input signal IN1 of 3 V ("1" level) is input, and simultaneously the N-MOS 104 is turned OFF since an input signal IN2 of 0 V ("0" level) is input. The P-MOS 103 is turned ON by the ON state of the N-MOS 102 and then the P-MOS 101 is turned OFF by the ON state of the P-MOS 103. Therefore, output signals OUT1 and OUT2 are at 5 V and 0 V respectively.

Then, the N-MOS 102 is turned OFF if a level of the input signal IN1 is changed from 3 V to 0 V, and simultaneously the N-MOS 104 is turned ON since a level of the input signal IN2 is changed from 0 V to 3 V. The P-MOS 101 is turned ON by the ON state of the N-MOS 104 and, as a result, the P-MOS 103 is turned OFF. Therefore, output signals OUT1 and OUT2 are at 0 V and 5 V, respectively.

In this manner, level conversion from the 3.3 V power-supply system to the 5 V power-supply system has been conducted in this level conversion circuit.

FIG. 2 is a circuit diagram showing a configuration of a level conversion circuit disclosed in the Patent Application Publication (KOKAI) 4-150411 (second conventional circuit).

As shown in FIG. 2, this level conversion circuit comprises a latch circuit 200 having the high voltage (VDD: 5 V) power supply. N-MOSs 211, 212 are connected between nodes N11, N12 of the latch circuit 200 and ground respectively. An input signal IN of low voltage (VCC: 3 V) power-supply system is input to a gate of the N-MOS 211. An inverted signal of the input signal IN is input to a gate of the N-MOS 212 via an inverter 213 having a low voltage (VCC: 3 V) power-supply system.

Under the condition that the nodes N11, N12 of the latch circuit 200 are at 5 V, 0 V respectively, if the input signal IN goes to 3 V ("1" level), the N-MOS 211 is turned ON while the N-MOS 212 is turned OFF. As a result, since potential of the node N11 is shifted to 0 V, an output signal OUT which is kept at 5 V ("1" level) can be derived from the node N12 of the latch circuit 200.

FIG. 3 is a circuit diagram showing a configuration of a level conversion circuit disclosed in U.S. Pat No. 5,300,832 (third conventional circuit).

By making use of MOS transistors only in which the breakdown voltage of the gate oxide film is lower than the high voltage power supply (5 V), this level conversion circuit may execute level conversion of the signal from the low voltage power-supply system to the high voltage power-supply system.

As shown in FIG. 3, this level conversion circuit comprises a level conversion portion which is made up of MOS transistors 300 to 313 and an output portion which is made up of MOS transistors 314 to 317. The level conversion circuit receives an input signal IN of the low voltage (VCC: 3 V) power-supply system and then outputs level conversion controlling signals to nodes N21, N22. The output portion, if it receives the controlling signals from the level conversion portion, outputs an output signal OUT1 of 0 V to 5 V as a signal of the high voltage (VDD: 5 V) power-supply system, and an output signal OUT2 of intermediate potential to 5 V, and further an output signal OUT3 of 0 V to intermediate potential.

If the input signal IN goes to "0" level, the P-MOSs 306, 307 are turned ON to pull up nodes N23, N24. The N-MOS 304 is turned ON according to "1" level of the node N23, so that a current path via the P-MOS 301 and the N-MOS 302 can be constituted. As a result, a node N25 is pulled down to cause turning ON of the P-MOS 308.

If the P-MOS 308 is turned ON, not only the node N21 goes to "1" level but also a current path passing through the P-MOS 309 and the N-MOSs 310, 311 is constituted, and therefore the node N22 also goes to "1" level. As a result, the P-MOS 314 is turned OFF while the N-MOS 317 is turned ON. The output signals OUT1 and OUT3 are at 0 V and the output signal OUT2 is at intermediate potential.

Meanwhile, if the input signal IN goes to "1" level, the N-MOSs 305, 312 are turned ON to pull down potential of the nodes N22, N23. The N-MOS 317 is turned OFF because of pull-down of the node N22. If potential of the node N21 becomes lower than VDD (5 V), the P-MOS 314 is turned ON. The output signals OUT1 and OUT2 are at 5 V and the output signal OUT3 is at intermediate potential.

However, the following problems have existed in the level conversion circuit in the prior art.

More particularly, in the first conventional circuit (FIG. 1), since a voltage of the high voltage power-supply level is applied to gates of all MOS transistors which constitute the level conversion circuit, the breakdown voltage of the gate oxide film has to exceed the high voltage power-supply level. Therefore, the high breakdown voltage MOS transistors in which the gate oxide films are made thicker and the gate lengths are made longer must be formed partially on a chip of the integrated circuit as the level conversion circuit. This structure needs complicated manufacturing processes.

Similarly, in the second conventional circuit (FIG. 2), respective transistors of two inverters constituting the latch circuit 200 and the N-MOSs 211 and 212 have to be made of the transistors whose gate oxide films have the breakdown voltage higher than the high voltage power-supply level.

For contrast, in the third conventional circuit (FIG. 3), unlike the first and second conventional circuits, the level conversion circuit may be composed of only the transistors in which the breakdown voltage of the gate oxide film is lower than the high voltage power-supply level. However, in order to suppress the breakdown voltage of the gate oxide film of the P-MOS 314 less than the high voltage power-supply level (VDD), an amplitude of the gate voltage (node N21) of the P-MOS 314 is limited by virtue of an OFF effect of the P-MOS 309. In other words, because potential VB is supplied to the gate of the P-MOS 309, potential of the node N21 cannot be lowered to "0" level, but it can be reduced merely up to $VB+V_{th}$ (where $V_{th}$ is a threshold voltage of the P-MOS). With the use of a phenomenon that potential of the node N21 is naturally stabilized at $VB+V_{th}$ according to OFF of the P-MOS 309, an amplitude of the gate voltage of the P-MOS 314 is limited. For this reason, such a problem has existed that high speed operation of the level conversion circuit cannot be achieved. In addition, if the P-MOS 314 is in the ON state, the gate voltage (potential of the node N21) becomes $VDD-(VB+V_{th})$ and therefore, if $VB+V_{th}$ is higher than 3 V, this gate voltage becomes a low value. Accordingly, another problem has also existed that load driving capability of the output portion is reduced.

SUMMARY OF THE INVENTION

The present invention has been made to overcome the above problems in the prior art, and it is an object of the present invention to provide a level conversion circuit which can be composed of only such MOS transistors that a breakdown voltage of a gate oxide film is lower than a high voltage power-supply level to thus suppress increase in power consumption in a non-operation state, and which enables a high speed operation and has sufficient load driving capability.

It is another object of the present invention, in addition to the above object, to provide a level conversion circuit which can operate precisely without malfunction.

It is still another object of the present invention, in addition to the above objects, to provide a level conversion circuit which can be used in wide application fields.

It is yet still another object of the present invention to provide a semiconductor integrated circuit in which the above level conversion circuit is incorporated.

In order to attain the above objects, according to an aspect of the present invention, there is provided a level conversion circuit comprising: a first CMOS circuit including first and second P-channel MOS transistors connected in series between a high voltage power supply for supplying a high voltage and a first output node, and first and second N-channel MOS transistors connected in series between the first output node and ground, a first signal being applied to a gate of the first P-channel MOS transistor serving as a pull-up transistor, an input signal which has an amplitude between a low voltage lower than the high voltage and a ground voltage being applied to a gate of the second N-channel MOS transistor serving as a pull-down transistor, and a low voltage being applied commonly to respective gates of the second P-channel MOS transistor and the first N-channel MOS transistor; a first intermediate circuit including a third P-channel MOS transistor connected between the high voltage power supply and a second output node and the first signal being applied to its gate, and a fourth P-channel MOS transistor connected between the second output node and a low voltage power supply for supplying a low voltage and potential of the first output node of the first CMOS circuit being applied to its gate; a second intermediate circuit including a fifth P-channel MOS transistor connected between the high voltage power supply and a third output node and potential of the second output node of the first intermediate circuit being applied to its gate, and a sixth P-channel MOS transistor connected between the third output node and the low voltage power supply and an output signal being applied to its gate, and for outputting the first signal from the third output node; and a second CMOS circuit including seventh and eighth P-channel MOS transistors connected in series between the high voltage power supply and a fourth output node, and third and fourth N-channel MOS transistors connected in series between the fourth output node and the ground, potential of the second output node of the first intermediate circuit being applied to a gate of the seventh P-channel MOS transistor serving as a pull-up transistor, an inverted signal of the input signal being applied to a gate of the fourth N-channel MOS transistor serving as a pull-down transistor, and the low voltage being applied commonly to respective gates of the eighth P-channel MOS transistor and the third N-channel MOS transistor, and for outputting a signal having an amplitude between the high voltage and the ground voltage from the fourth output node to an outside as the output signal.

According to the present invention, if the input signal is at low voltage level ("1" level), the second N-MOS is turned ON, whereby the fourth P-MOS is turned ON. As a result, the fifth and seventh P-MOSs are also turned ON. Meanwhile, the fourth N-MOS is turned OFF by the inverted signal of the input signal and then the sixth P-MOS is turned OFF. Consequently, the first and third P-MOSs are turned OFF. Accordingly, the output signal of the high voltage level ("1" level) is output. In this state, since the first, third, and sixth P-MOSs and the fourth N-MOS are in OFF state, no static current path exists in this level conversion circuit. Next, if the input signal is changed from the low voltage level to the ground level ("0" level), the fourth N-MOS is turned ON and then the sixth P-MOS is turned ON and as a result the first and third P-MOSs are also turned ON. Then, since the fourth P-MOS is turned OFF, the fifth and seventh P-MOSs are turned OFF to thus cut off the current path. Then, the output signal of ground level is output. During these operations, since the potential exceeding the low voltage level is not applied statically to the gate oxide films of the above MOS transistors, the level conversion circuit can be composed of only the MOS transistors in which the allowable breakdown voltage of the gate oxide film is lower than 5 V. In addition, since a scheme is adopted wherein the given power supply level is supplied to gates of succeeding transistors via ONed transistors, not only a high speed operation rather than the third conventional circuit which employs an effect of turning OFF of the source follower transistor to limit an amplitude of the gate voltage can be accomplished, but also reduction in load driving capability can be suppressed. By preparing the low voltage power supplies to be connected to the MOS transistors independently as different low voltage power supplies, ON resistances of the MOS transistors can be adjusted.

In the preferred embodiment of the present invention, series ON resistances of the first and second P-channel MOS transistors are set larger than series ON resistances of the first and second N-channel MOS transistors in the first CMOS circuit, and series ON resistances of the seventh and eighth P-channel MOS transistors are set larger than series ON resistances of the third and fourth N-channel MOS transistors in the second CMOS circuit, and an ON resistance of the third P-channel MOS transistor is set larger than an ON resistance of the fourth P-channel MOS transistor in the first intermediate circuit, and an ON resistance of the fifth P-channel MOS transistor is set larger than an ON resistance of the sixth P-channel MOS transistor in the second intermediate circuit.

According to this embodiment, the level conversion circuit can be operated precisely.

According to another aspect of the present invention, there is provided a level conversion circuit comprising: a first CMOS circuit including first and second P-channel MOS transistors connected in series between a high voltage power supply for supplying a high voltage and a first output node, and first and second N-channel MOS transistors connected in series between the first output node and ground, a first signal being applied to a gate of the first P-channel MOS transistor serving as a pull-up transistor, an input signal which has an amplitude between a low voltage lower than the high voltage and a ground voltage being applied to an input node connected to a gate of the second N-channel MOS transistor serving as a pull-down transistor, and a low voltage being applied commonly to respective gates of the second P-channel MOS transistor and the first N-channel MOS transistor; a first intermediate circuit including a third P-channel MOS transistor connected between the high voltage power supply and a second output node and the first signal being applied to its gate, and a fourth P-channel MOS transistor connected between the second output node and a low voltage power supply for supplying a low voltage and potential of the first output node of the first CMOS circuit being applied to its gate; a second intermediate circuit including a fifth P-channel MOS transistor connected between the high voltage power supply and a third output node and potential of the second output node of the first intermediate circuit being applied to its gate, and a sixth P-channel MOS transistor connected between the third output node and the low voltage power supply and an output signal being applied to its gate, and for outputting the first signal from the third output node; and a second CMOS circuit including seventh and eighth P-channel MOS transistors connected in series between the high voltage power supply and a fourth output node, and a third N-channel MOS transistor connected between the fourth output node and the input node, potential of the second output node of the first intermediate circuit being applied to a gate of the seventh P-channel MOS transistor serving as a pull-up transistor, and the low voltage being applied commonly to respective gates of the eighth P-channel MOS transistor and the third N-channel MOS transistor serving as a pull-down transistor, and for outputting a signal having an amplitude between the high voltage and the ground voltage from the fourth output node to an outside as the output signal.

According to the present invention, the fourth N-MOS in the above first invention can be omitted and therefore one type of the input signal is needed. If the input signal is at low voltage level ("1" level), similar operations to the first invention are carried out, and the output signal of high voltage level ("1" level) is output. In this state, since the first, third, and sixth P-MOSs and the third N-MOS are in OFF state, no static current path exists in this level conversion circuit. Next, if the input signal is changed from the low voltage level to the ground level ("0" level), the second N-MOS is turned OFF and then the third N-MOS is turned ON and thereafter similar operations to the first invention are carried out and, as a result, the output signal of the ground level is output. Thereby, like the first invention, the level conversion circuit can be composed of only the MOS transistors in which the allowable breakdown voltage of the gate oxide film is lower than the high voltage power supply. In addition, not only a high speed operation rather than the third conventional circuit which employs an effect of turning OFF of the source follower transistor to limit an amplitude of the gate voltage can be accomplished, but also reduction in load driving capability can be suppressed.

According to still another aspect of the present invention, there is provided a level conversion circuit comprising: a first CMOS circuit including first and second P-channel MOS transistors connected in series between a high voltage power supply for supplying a high voltage and a first output node, and a first N-channel MOS transistor connected between the first output node and an input node, a first signal being applied to a gate of the first P-channel MOS transistor serving as a pull-up transistor, an input signal which has an amplitude between a low voltage lower than the high voltage and a ground voltage being applied to the input node which is connected to a source of the first N-channel MOS transistor serving as a pull-down transistor, and a low voltage being applied commonly to respective gates of the second P-channel MOS transistor and the first N-channel MOS transistor; a first intermediate circuit including a third P-channel MOS transistor connected between the high voltage power supply and a second output node and the first signal being applied to its gate, and a fourth P-channel MOS transistor connected between the second output node and a low voltage power supply for supplying a low voltage and potential of the first output node of the first CMOS circuit being applied to its gate; a second intermediate circuit including a fifth P-channel MOS transistor connected between the high voltage power supply and a third output node and potential of the second output node of the first intermediate circuit being applied to its gate, and a sixth P-channel MOS transistor connected between the third output node and the low voltage power supply and an output signal being applied to its gate, and for outputting the first signal from the third output node; and a second CMOS circuit including seventh and eighth P-channel MOS transistors connected in series between the high voltage power supply and a fourth output node, and second and third N-channel MOS transistors connected in series between the fourth output node and the ground, potential of the second output node of the first intermediate circuit being applied to a gate of the seventh P-channel MOS transistor serving as a pull-up transistor, the input signal being applied to a gate of the third N-channel MOS transistor serving as a pull-down transistor, and the low voltage being applied commonly to respective gates of the eighth P-channel MOS transistor and the second N-channel MOS transistor, and for outputting a signal having an amplitude between the high voltage and the ground voltage from the fourth output node to an outside as the output signal.

According to the present invention, the second N-MOS in the above first invention can be omitted and therefore one type of the input signal is needed. If the input signal is at ground level ("0" level), the first N-MOS is turned ON and thereafter similar operations to the first invention are carried out, and the output signal of high voltage level ("1" level) is output. In this state, like the above, no static current path exists in this level conversion circuit. Next, if the input signal is changed from the ground level to the high voltage level ("1" level), the first N-MOS is turned OFF and then the third N-MOS is turned ON and thereafter similar operations to the first invention are carried out and as a result the output signal of the ground level is output. Also, in this invention, the level conversion circuit can be composed of only the MOS transistors in which the allowable breakdown voltage of the gate oxide film is lower than the high voltage power supply. In addition, not only a high speed operation rather than the third conventional circuit which employs an effect of turning OFF of the source follower transistor to limit an amplitude of the gate voltage can be accomplished, but also reduction in load driving capability can be suppressed.

According to yet still another aspect of the present invention, there is provided a level conversion circuit comprising: a first CMOS circuit including first and second P-channel MOS transistors connected in series between a high voltage power supply for supplying a high voltage and a first output node, and a first N-channel MOS transistor connected between the first output node and a first input node, a first signal being applied to a gate of the first P-channel MOS transistor serving as a pull-up transistor, an input signal which has an amplitude between a low voltage lower than the high voltage and a ground voltage being applied to the first input node connected to a source of the first N-channel MOS transistor serving as a pull-down transistor, and a low voltage being applied commonly to respective gates of the second P-channel MOS transistor and the first N-channel MOS transistor; a first intermediate circuit including a third P-channel MOS transistor connected between the high voltage power supply and a second output node and the first signal being applied to its gate, and a fourth P-channel MOS transistor connected between the second output node and a low voltage power supply for supplying a low voltage and potential of the first output node of the first CMOS circuit being applied to its gate; a second intermediate circuit including a fifth P-channel MOS transistor connected between the high voltage power supply and a third output node and potential of the second output node of the first intermediate circuit being applied to its gate, and a sixth P-channel MOS transistor connected between the third output node and the low voltage power supply and an output signal being applied to its gate, and for outputting the first signal from the third output node; and a second CMOS circuit including seventh and eighth P-channel MOS transistors connected in series between the high voltage power supply and a fourth output node, and a second N-channel MOS transistor connected between the fourth output node and the second input node, potential of the second output node of the first intermediate circuit being applied to a gate of the seventh P-channel MOS transistor serving as a pull-up transistor, an inverted signal of the input signal being applied to the second input node connected to a source of the second N-channel MOS transistor serving as a pull-down transistor, and the low voltage being applied commonly to respective gates of the eighth P-channel MOS transistor and the second N-channel MOS transistor, and for outputting a signal having an amplitude between the high voltage and the ground voltage from the fourth output node to an outside as the output signal.

According to the present invention, the second and fourth N-MOSs in the above first invention can be omitted. If the input signal is at ground level ("0" level), the first N-MOS is turned ON and thereafter similar operations to the first invention are carried out, and the output signal of high voltage level ("1" level) is output. In this state, since the first, third, and sixth P-MOSs and the second N-MOS are in OFF state, no static current path exists in this level conversion circuit. Next, if the input signal is changed from the ground level to the high voltage level ("1" level), the first N-MOS is turned OFF and then the second N-MOS is turned ON and thereafter similar operations to the first invention are carried out and as a result the output signal of the ground level is output. Also, in this invention, the level conversion circuit can be composed of only the MOS transistors in which the allowable breakdown voltage of the gate oxide film is lower than the high voltage power supply. In addition, not only a high speed operation rather than the third conventional circuit which employs an effect of turning OFF of the source follower transistor to limit an amplitude of the gate voltage can be accomplished, but also reduction in load driving capability can be suppressed.

In the preferred embodiment of the present invention, the first signal is a signal having an amplitude between the high voltage and the low voltage, and the first signal is output to the outside independently of the output signal.

According to this embodiment, the circuit of the present invention can be used in wide application fields.

In the preferred embodiment of the present invention, substrates of the fourth and sixth P-channel MOS transistors are connected to respective source sides so as to be isolated from substrates of other P-channel MOS transistors.

According to this embodiment, load to the gate oxide film of the fourth and sixth P-MOSs can be reduced still further.

According to further aspect of the present invention, there is provided a semiconductor integrated circuit comprising: a low voltage power supply circuit connected between a low voltage power supply for supplying a low voltage and ground, for outputting a first signal having an amplitude between the low voltage and a ground voltage; and a level conversion circuit for level-converting the first signal output from the low voltage power supply circuit into a second signal having an amplitude between a high voltage higher than the low voltage and the ground voltage; and wherein the level conversion circuit is made up of a level conversion circuit of the above present invention.

According to the present invention, the semiconductor integrated circuit including the level conversion circuit capable of achieving the above advantages can be provided.

The nature, principle and utility of the invention will become more apparent from the following detailed description when read in conjunction with the accompanying drawings.

DESCRIPTION OF THE PREFERRED EMBODIMENTS

Embodiments of the present invention will be explained with reference to the accompanying drawings hereinbelow.

Figure 1:
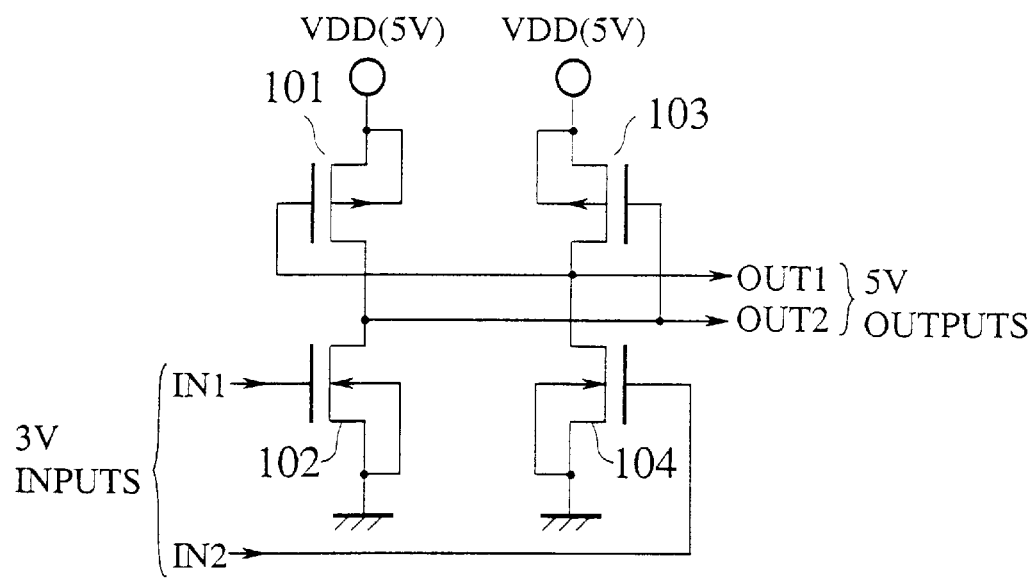
FIG. 1 is a circuit diagram showing a first configuration of a level conversion circuit in the prior art (first conventional circuit)
Figure 2:
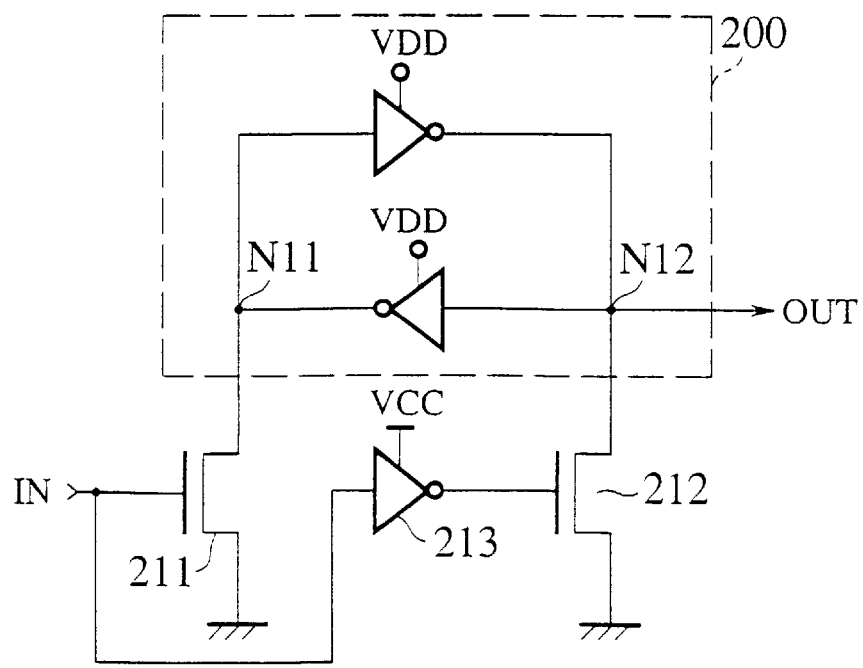
FIG. 2 is a circuit diagram showing a second configuration of a level conversion circuit in the prior art (second conventional circuit)
Figure 3:
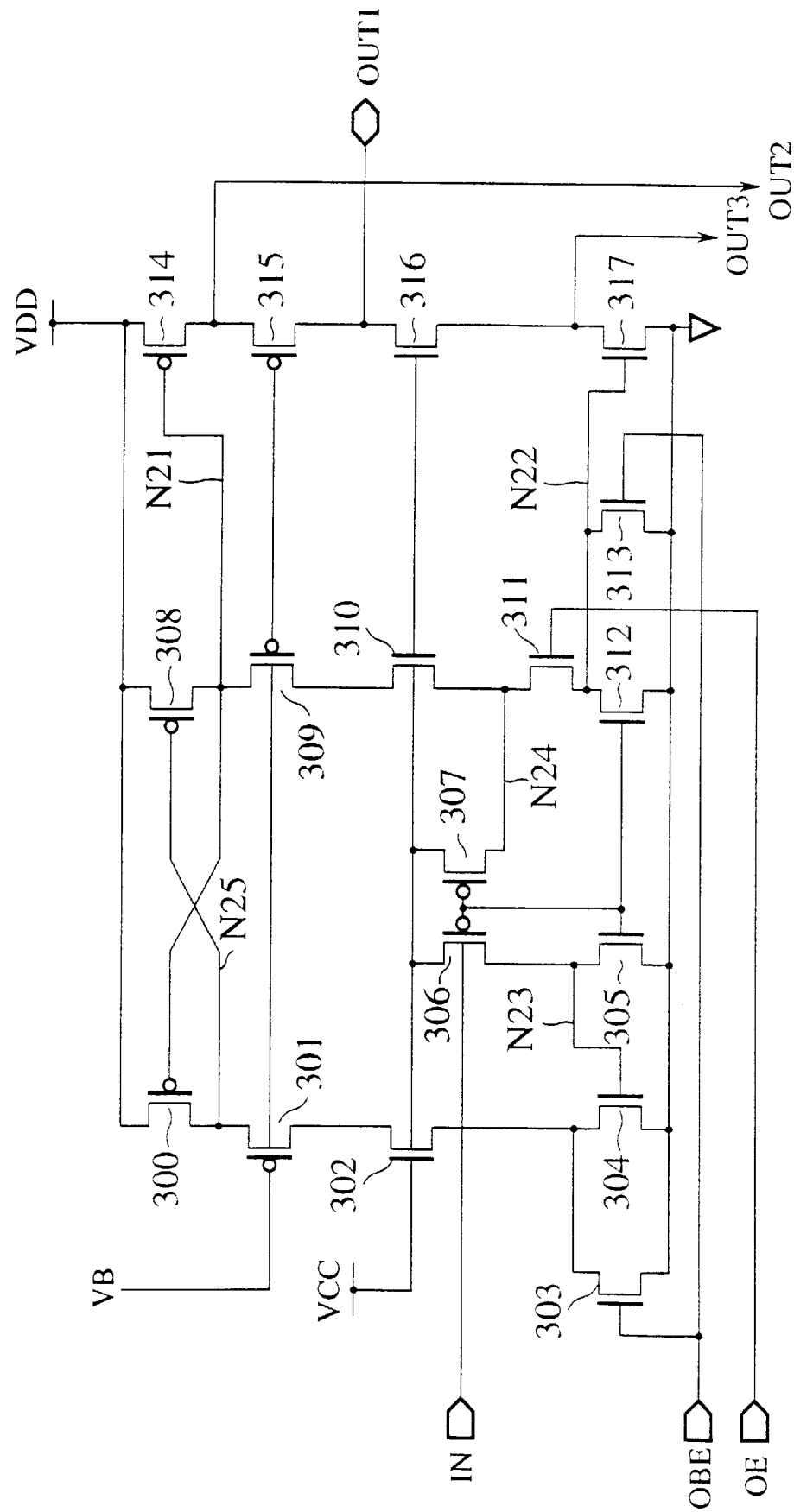
FIG. 3 is a circuit diagram showing a third configuration of a level conversion circuit in the prior art (third conventional circuit)
Figure 4:
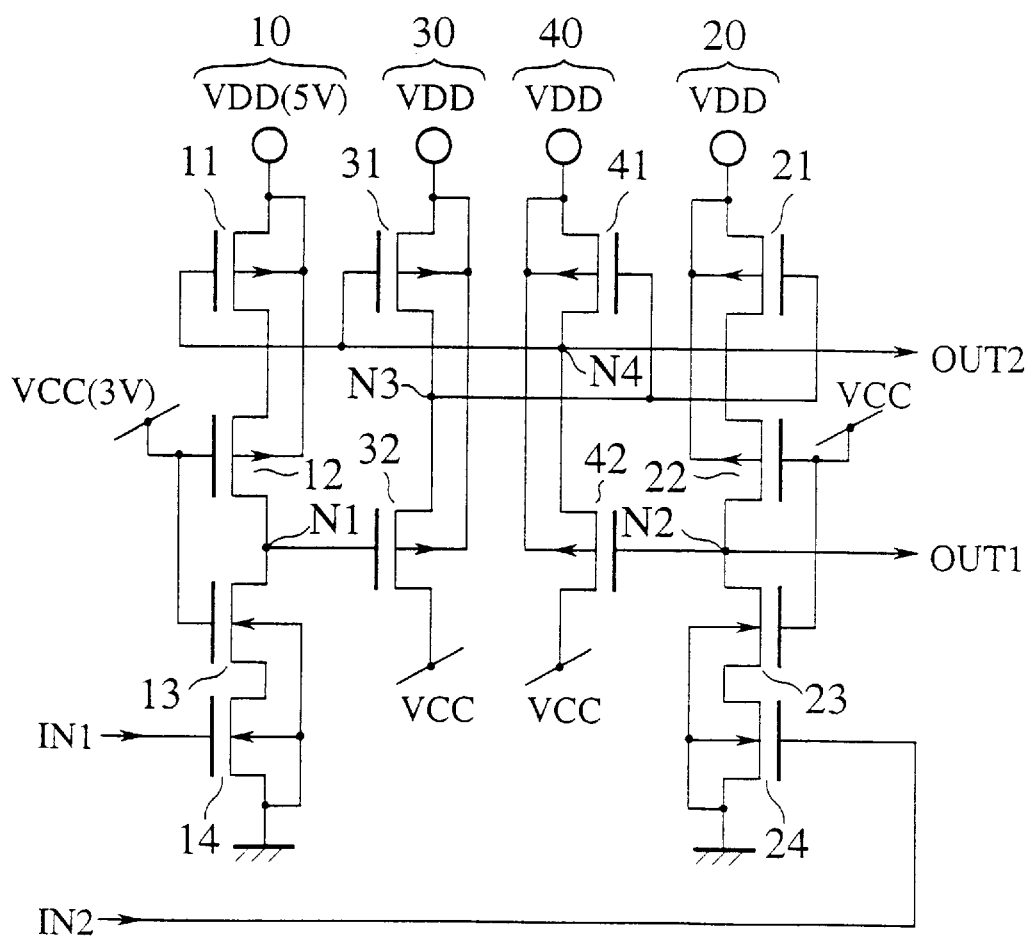
FIG. 4 is a circuit diagram showing a configuration of a level conversion circuit according to a first embodiment of the present invention.

FIG. 4 is a circuit diagram showing a configuration of a level conversion circuit according to a first embodiment of the present invention.

This level conversion circuit comprises a first CMOS circuit 10 connected between a high voltage (5 V: VDD) power supply and ground, for receiving an input signal IN1 having an amplitude between a low voltage (3 V: VCC) and a ground voltage (0 V); a second CMOS circuit 20 connected between the 5 V power supply and ground, for outputting an output signal OUT1 having an amplitude between 5 V and 0 V; and first and second intermediate circuits 30, 40 cross-connected between the first and second CMOS circuits 10 and 20. All transistors constituting these circuits 10, 20, 30, 40 (which will be described later) have the gate oxide films whose allowable breakdown voltage are less than 5 V and more than 3 V.

More particularly, the first CMOS circuit 10 consists of P-MOSs 11, 12 which are connected in series between the 5 V power supply and a node N1, and N-MOSs 13, 14 which are connected in series between the node N1 and the ground. The P-MOS 11 functions a pull-up transistor, and an output signal (first signal) of the second intermediate circuit 40 is applied to a gate of the P-MOS 11. The N-MOS 14 functions a pull-down transistor, and the input signal IN1 is applied to a gate of the N-MCS 14.

The P-MOS 12 and the N-MOS 13 are provided as overvoltage protection transistors for the P-MOS 11 and the N-MOS 14 respectively. The 3 V power supply voltage is applied commonly to respective gates of the P-MOS 12 and the N-MOS 13. Further, a substrate (N type well region) of the P-MOS 12 as well as a substrate (N type well region) of the P-MOS 11 are connected commonly to the 5 V power supply. A substrate of the N-MOS 13 as well as a substrate of the N-MOS 14 are connected commonly to the ground.

As in the circuit configuration of the first CMOS circuit 10, the second CMOS circuit 20 consists of P-MOSs 21, 22 which are connected in series between the 5 V power supply and a node N2, and N-MOSs 23, 24 which are connected in series between the node N2 and the ground. An output signal of the first intermediate circuit 30 is applied to a gate of the P-MOS 21 which serves as a pull-up transistor. An inverted signal IN2 of the input signal IN1 is applied to a gate of the N-MOS 24 which serves as a pull-down transistor.

The first intermediate circuit 30 consists of a P-MOS 31 which is connected between the 5 V power supply and a node N3 and a gate of which receives the output signal (first signal) of the second intermediate circuit 40, and a P-MOS 32 which is connected between the node N3 and the 3 V power supply and a gate of which receives potential of the node N1 of the first CMOS circuit 10. A substrate of the P-MOS 31 as well as a substrate of the P-MOS 32 are connected commonly to the 5 V power supply.

Like the device configuration of the above first intermediate circuit 30, the second intermediate circuit 40 consists of a P-MOS 41 which is connected between the 5 V power supply and a node N4 and a gate of which receives potential of the node N3 of the first intermediate circuit 30, and a P-MOS 42 which is connected between the node N4 and the 3 V power supply and a gate of which receives the output signal OUT1.

The output signal OUT1 which is in-phase of the input signal IN1 and has an amplitude between 5 V ("1" level) and 0 V ("0" level) is output from the node N2 of the second CMOS circuit 20. In addition, the output signal OUT2 which is in-phase of the input signal IN1 and has an amplitude between 5 V ("1" level) and 3 V ("0" level) is output from the node N4 of the second intermediate circuit 40.

In order to operate this level conversion circuit precisely, ON resistances of respective MOS transistors are designed according to the following conditions. More particularly, the dimensions of respective MOS transistors are set such that series ON resistances of the P-MOSs 11, 12 are larger than those of the N-MOSs 13, 14 in the first CMOS circuit 10. Similar setting is made on the P-MOSs 21, 22 and the N-MOSs 23, 24 in the second CMOS circuit 20. Furthermore, the dimensions of respective MOS transistors are set such that ON resistance of the P-MOS 31 is larger than that of the P-MOS 32 in the first intermediate circuit 30 and that ON resistance of the P-MOS 41 is larger than that of the P-MOS 42 in the second intermediate circuit 40.

Next, an operation of the level conversion circuit constructed as above will be explained.

First, an operation of the level conversion circuit will be explained in case an input signal IN1 of 3 V ("1" level) is supplied. If applied to a gate of the N-MOS 14, the input signal IN1 of 3 V ("1" level) turns the N-MOS 14 ON, then a voltage close to 0 V is output from the node N1 based on the above setting of the ON resistances. As a result, the P-MOS 32 is turned ON, then the node N3 outputs a voltage close to 3 V, and then the P-MOSs 41, 21 are turned ON.

In contrast, since the input signal IN2 of 0 V ("0" level) is applied to the gate of the N-MOS 24, the N-MOS 24 is turned OFF and potential of the node N2 goes to 5 V. Consequently, the P-MOS 42 is turned OFF while the P-MOS 41 is turned ON and therefore potential of the node N4 goes to 5 V. Then, the P-MOSs 11, 31 are turned OFF and potential of the node N1 goes to 0 V and potential of the node N3 goes to 3 V. Hence, the output signals OUT1 and OUT2 go to 5 V ("1" level).

In this state, since the P-MOSs 11, 31, 42 and the N-MOS 24 are turned OFF, there exists no static current path in this level conversion circuit.

Subsequently, an operation of the level conversion circuit will be explained in case the input signal IN1 is changed from 3 V ("1" level) to 0 V ("0" level).

Because the N-MOS 14 and the P-MOS 11 are in OFF state, potential of the node N1 is not defined. However, although the N-MOS 24 is turned ON because the input signal IN2 is at 3 V ("1" level) and at this time the P-MOS 21 is in ON state, potential of the node N2 becomes close to 0 V. As a result, although the P-MOS 42 is turned ON and at this time the P-MOS 41 is in ON state, potential of the node N4 becomes close to 3 V.

The P-MOSs 11, 31 are turned ON if potential of the node N4 becomes close to 3 V, then the node N1 outputs 5 V since the N-MOS 14 has already turned OFF. As a result, since the P-MOS 32 is also turned OFF and the potential of the node N3 goes to 5 V, the P-MOSs 41, 21 are turned OFF to cut off the current path, and therefore the node N2 outputs 0 V while the node N4 outputs 3 V. Hence, the output signal OUT1 at 0 V ("0" level) is output and the output signal OUT2 at 3 V ("0" level) is output.

In such operation, voltages in excess of 3 V are in no way applied between gates and sources or drains or substrates of respective MOS transistors. However, a signal with an amplitude of 5 V to 0 V is applied to both the P-MOS 32, 42 and the voltage in excess of 3 V is applied transiently to the gate oxide film when the voltage of 0 V is applied. But the MOS transistors are turned ON so that a channel connected to the 3 V power supply is constituted between the source and drain regions in a non-operation state. Therefore, since substrate potential of 5 V can be shielded from the gate oxide film, the potential exceeding 3 V is in no case applied statically to the gate oxide film.

In the level conversion circuit according to the first embodiment, since the potential more than 3 V is not applied statically to the gate oxide films of the above MOS transistors, the circuit can be composed of only the MOS transistors in which the allowable breakdown voltage of the gate oxide film is lower than 5 V. Thereby, the level conversion circuit with low consumption power can be accomplished without making the manufacturing process complicated. In addition, since a scheme is adopted wherein the given power supply level is supplied to gates of succeeding transistors via ONed transistors, not only a high speed operation rather than the third conventional circuit which employs an effect of turning OFF of the source follower transistor to limit an amplitude of the gate voltage can be accomplished, but also reduction in load driving capability can be suppressed.

In the first embodiment, all the low voltage levels are set to 3 V. However, in the event that additional potential of 2 V, for example, is present in the level conversion circuit, the circuit can operate normally even if only gates of the P-MOSs 12, 22 are connected to the 2 V voltage source or if only drains of the P-MOSs 32, 42 are connected to the 2 V voltage source. If the ON resistances of the transistors are adjusted by connecting terminals which being connected to the 3 V power supply to other low voltage level separately, the sufficient margin can be afforded in designing the dimensions of MOS transistors.

Figure 5:
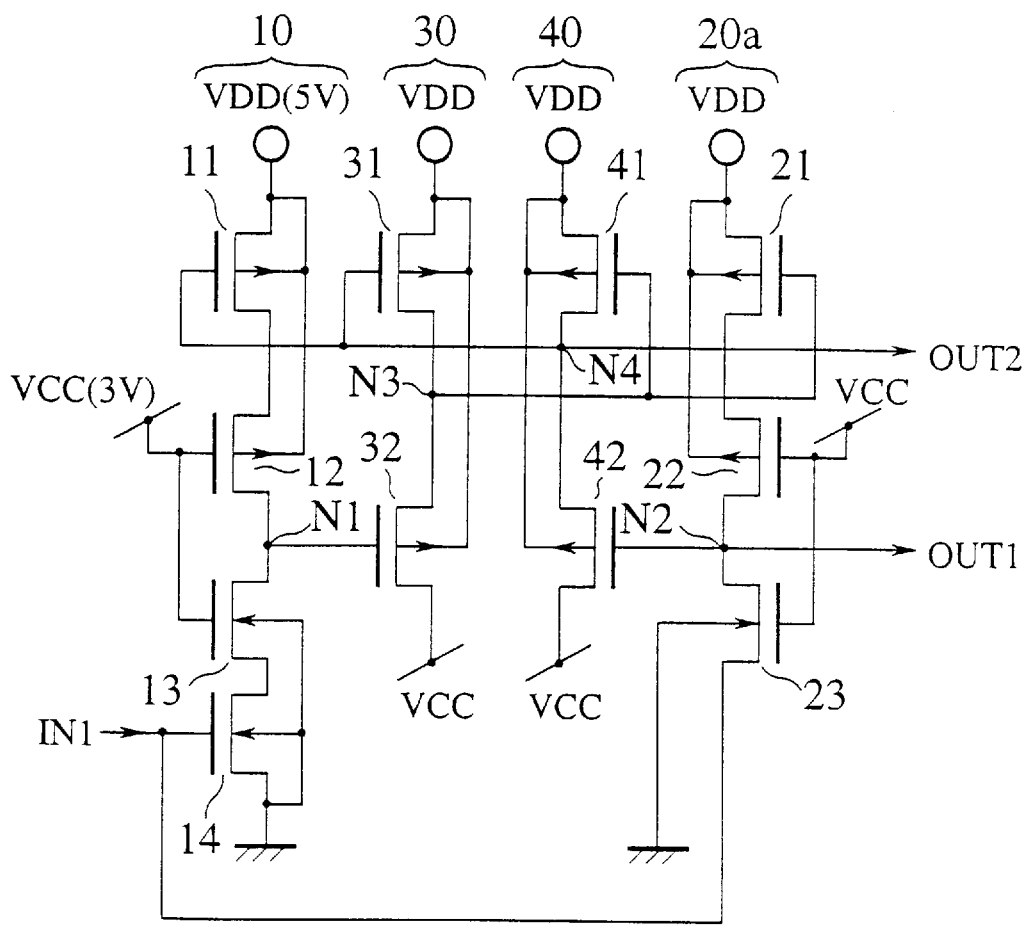
FIG. 5 is a circuit diagram showing a configuration of a level conversion circuit according to a second embodiment of the present invention.

FIG. 5 is a circuit diagram showing a configuration of a level conversion circuit according to a second embodiment of the present invention. In FIG. 5, the same parts or elements to those in FIG. 4 are denoted by the same references.

In the configuration shown in FIG. 4, if an input signal with an amplitude between 0 V to 3 V is connected directly to a source of the N-MOS 23, a circuit operation of the level conversion circuit is by no means effected. Thus, the second embodiment shows an example wherein the N-MOS 24 is omitted from the level conversion circuit shown in FIG.4. Namely, a second CMOS circuit 20a provided in place of the second CMOS circuit 20 is so constituted that the N-MOS 24 is omitted and then the input signal IN1 is applied directly to a source of the N-MOS 23.

This level conversion circuit can carry out operations similar to the above first embodiment if the input signal IN1 is 3 V ("1" level), and then the output signals OUT1 and OUT2 of 5 V ("1" level) are output from this level conversion circuit. In this state, since the P-MOSs 11, 31, 42 are in OFF state and also the N-MOS 23 is in OFF state, no static current path resides in this level conversion circuit. In contrast, in case the input signal IN1 is changed from 3 V ("1" level) to 0 V ("0" level), the output signal OUT1 is changed into 0 V ("0" level) and also the output signal OUT2 is changed into 3 V ("0" level), like the first embodiment, since the N-MOS 14 is turned OFF and the N-MOS 23 is turned ON.

In the second embodiment, in addition to advantages similar to those achieved by the first embodiment, a configuration of the level conversion circuit can be simplified rather than the first embodiment since the N-MOS 24 shown in FIG. 4 can be omitted and only one type of input signal is required.

Figure 6:
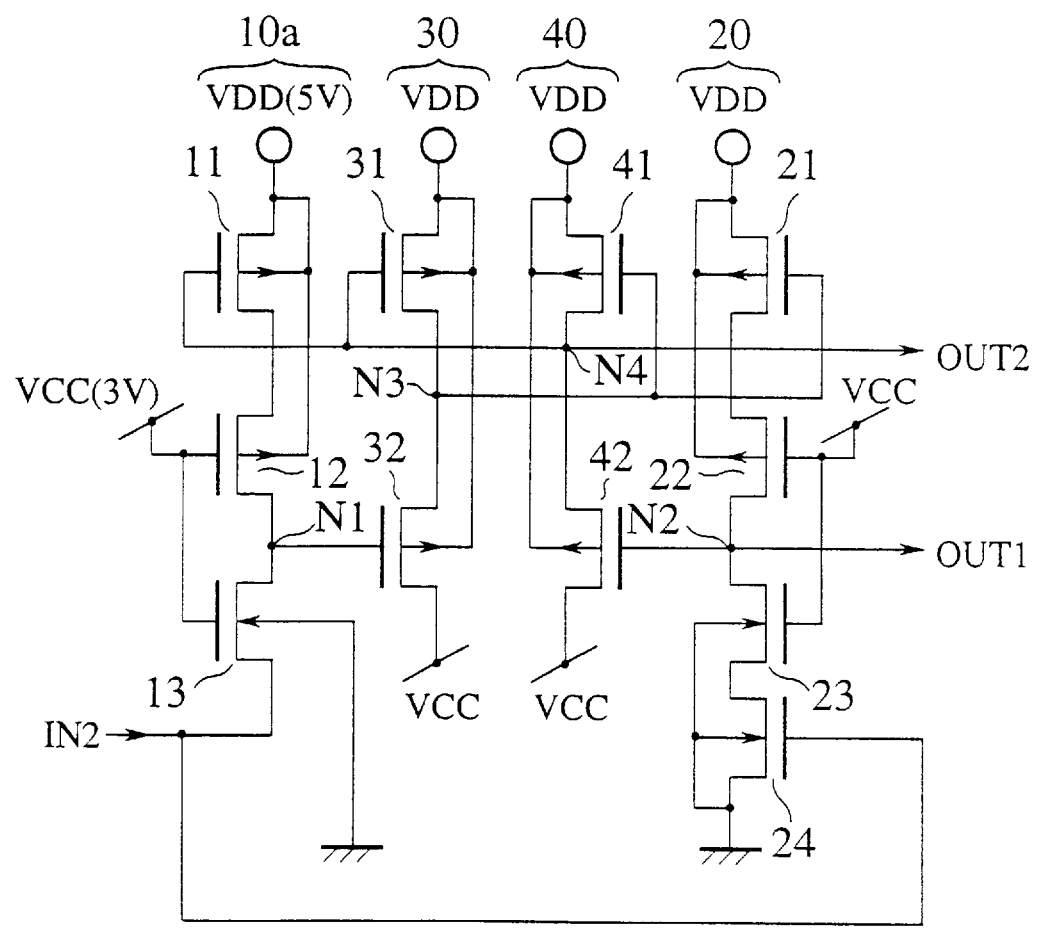
FIG. 6 is a circuit diagram showing a configuration of a level conversion circuit according to a third embodiment of the present invention.

FIG. 6 is a circuit diagram showing a configuration of a level conversion circuit according to a third embodiment of the present invention. In FIG. 6, the same parts or elements to those in FIG. 4 are denoted by the same references.

In the configuration shown in FIG. 4, a circuit operation of the level conversion circuit is not by any means disturbed even if an input signal having an amplitude from 0 V to 3 V is applied directly to a source of the N-MOS 13. Thus, the third embodiment shows an example wherein the N-MOS 14 is omitted from the level conversion circuit shown in FIG. 4. That is, a first CMOS circuit 10a provided in place of the first CMOS circuit 10 is so constituted that the N-MOS 14 is omitted and then the input signal IN2 is applied directly to a source of the N-MOS 13.

According to this level conversion circuit, the N-MOS 13 is turned ON if the input signal IN2 is 0 V ("0" level), and thereafter operations similar to the above first embodiment are executed and then the output signals OUT1 and OUT2 of 5 V ("1" level) are output from this level conversion circuit. In this state, since the P-MOSs 11, 31, 42 are in OFF state and also the N-MOS 24 is in OFF state, no static current path is present in this level conversion circuit.

In contrast, in case the input signal IN2 is changed from 0 V ("0" level) to 3 V ("1" level), the N-MOS 13 is turned OFF while the N-MOS 24 is turned ON and thereafter operations similar to the above first embodiment are executed, and the output signal OUT1 is changed into 0 V ("0" level) and also the output signal OUT2 is changed into 3 V ("0" level).

In this manner, the output signals OUT1 and OUT2 which are in opposite phase to the input signal IN2 are output.

In the third embodiment, in addition to advantages similar to those achieved by the first embodiment, a configuration of the level conversion circuit can be simplified rather than the first embodiment since the N-MOS 24 shown in FIG. 4 can be omitted and only one type of input signal is required.

Figure 7:
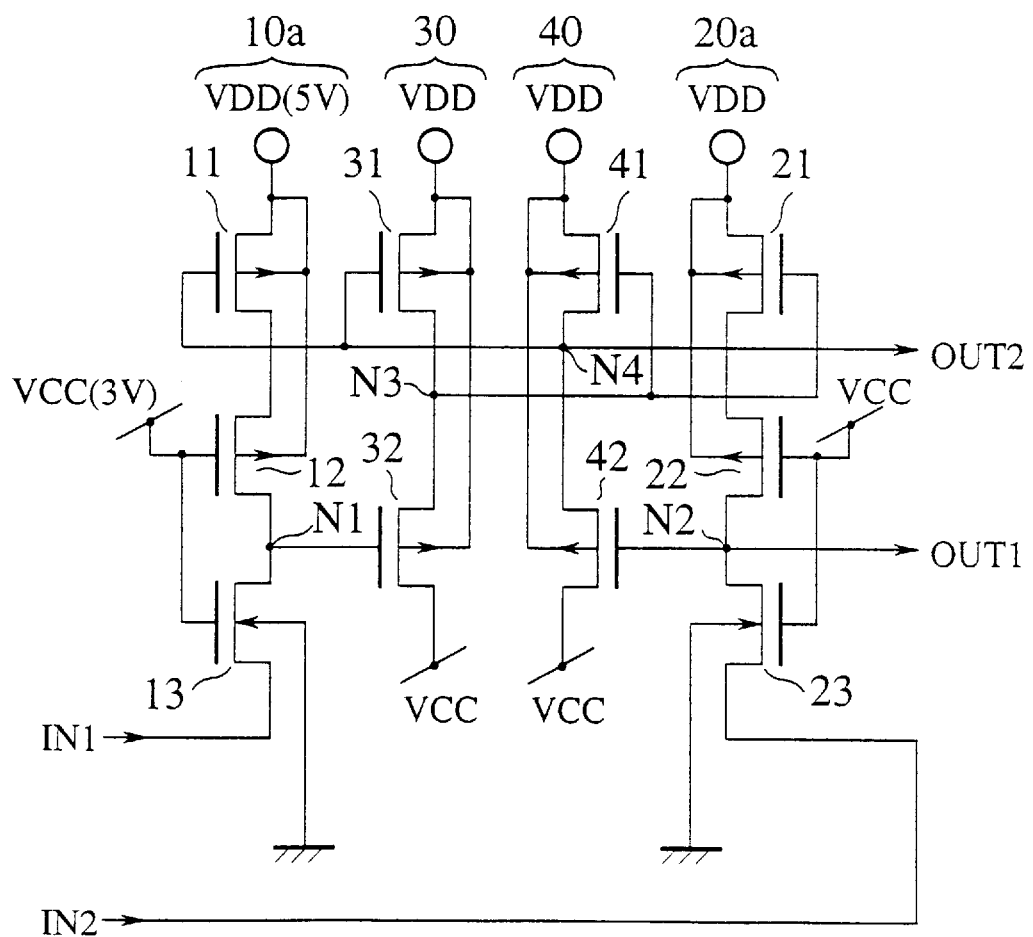
FIG. 7 is a circuit diagram showing a configuration of a level conversion circuit according to a fourth embodiment of the present invention.

FIG. 7 is a circuit diagram showing a configuration of a level conversion circuit according to a fourth embodiment of the present invention. In FIG. 7, the same parts or elements to those in FIG. 4 are denoted by the same references.

In the configuration shown in FIG. 4, a circuit operation of the level conversion circuit is in no sense spoiled even if an input signal having an amplitude from 0 V to 3 V is applied directly to sources of the N-MOSs 13 and 23. Thus, the fourth embodiment shows an example wherein the N-MOSs 14 and 24 are omitted from the level conversion circuit shown in FIG. 4. More particularly, first and second CMOS circuits 10a, 20a provided in place of the first and second CMOS circuits 10, 20 are so constituted that the N-MOSs 14, 24 are omitted and then the input signals IN1, IN2 are applied directly to sources of the N-MOSs 13, 23.

According to this level conversion circuit, the N-MOS 13 is turned ON if the input signal IN1 is 0 V ("0" level), and thereafter operations similar to the above first embodiment are carried out and then the output signals OUT1 and OUT2 of 5 V ("1" level) are output from this level conversion circuit. In this time, since the P-MOSs 11, 31, 42 are in OFF state and also the input signal IN2 of 3 V ("1" level) is supplied to the source of the N-MOS 23, the N-MOS 23 is also in OFF state. As a result, in this state, no static current path is present in this level conversion circuit.

On the contrary, in case the input signal IN1 is changed from 0 V ("0" level) to 3 V ("1" level), the N-MOS 13 is turned OFF and the N-MOS 23 is turned ON and thereafter operations similar to the above first embodiment are executed, and the output signal OUT1 is changed into 0 V ("0" level) and also the output signal OUT2 is changed into 3 V ("0" level).

In this fashion, the output signals OUT1 and OUT2 which are in opposite phase to the input signal IN1 are output.

In the fourth embodiment, in addition to advantages similar to those achieved by the first embodiment, a configuration of the level conversion circuit can be simplified rather than the first embodiment since the N-MOSs 14, 24 shown in FIG. 4 can be omitted.

Figure 8:
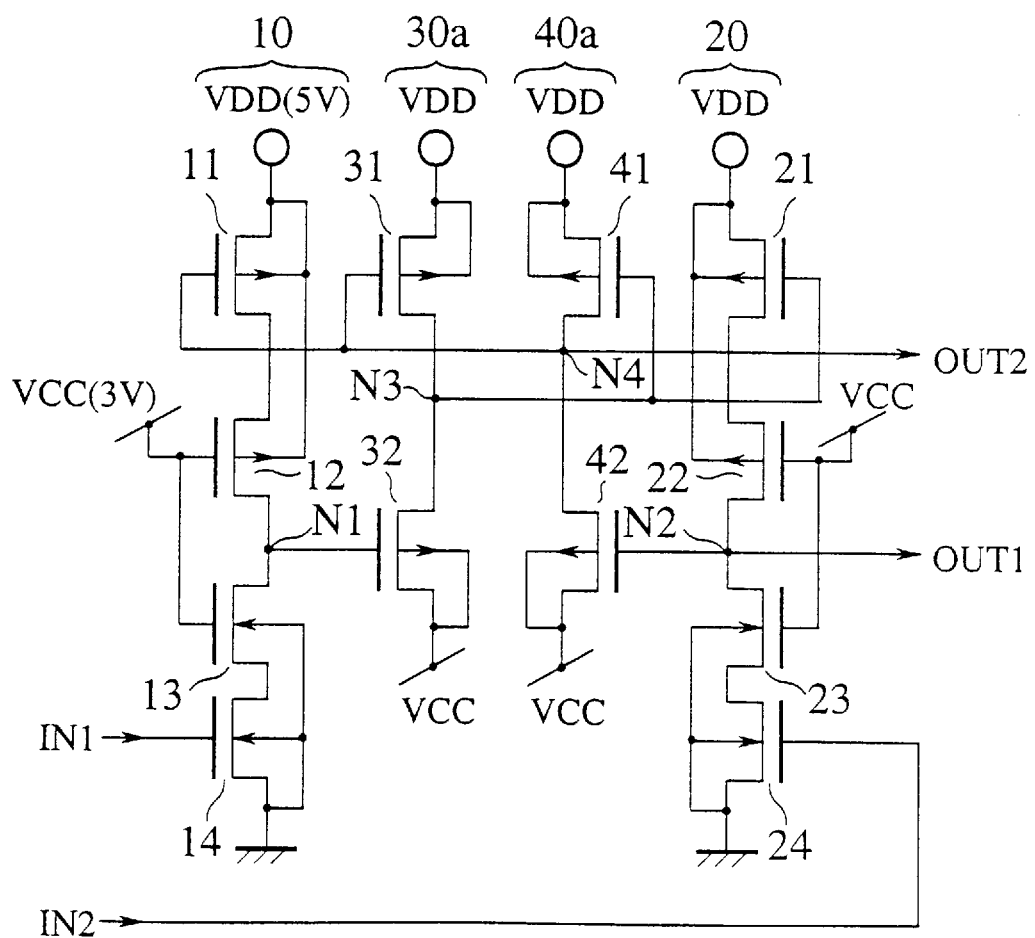
FIG. 8 is a circuit diagram showing a configuration of a level conversion circuit according to a fifth embodiment of the present invention.

FIG. 8 is a circuit diagram showing a configuration of a level conversion circuit according to a fifth embodiment of the present invention. In FIG. 8, the same parts or elements to those in FIG. 4 are denoted by the same references.

In the fifth embodiment, first and second intermediate circuits 30a, 40a in which substrates are connected differently from the first and second intermediate circuits 30, 40 in the configuration in FIG.4 are provided instead of the first and second intermediate circuits 30, 40. In other words, in the first embodiment, it has been stated that the gate oxide film can be shielded from the substrate potential of 5 V by the channel formed when the P-MOSs 32, 42 are turned ON and therefore potential in excess of 3 V is not applied statically to the gate oxide films of the transistors. With respect to this event, in the fifth embodiment, by connecting N type wells (substrates) serving as substrates of the P-MOSs 32, 42 to respective sources separately from the N type wells (substrates) of other P-MOSs, load to the gate oxide films of the P-MOSs 32, 42 can be reduced still further.

In this case, a circuit operation of the fifth embodiment is completely similar to the above first embodiment.

Figure 9:
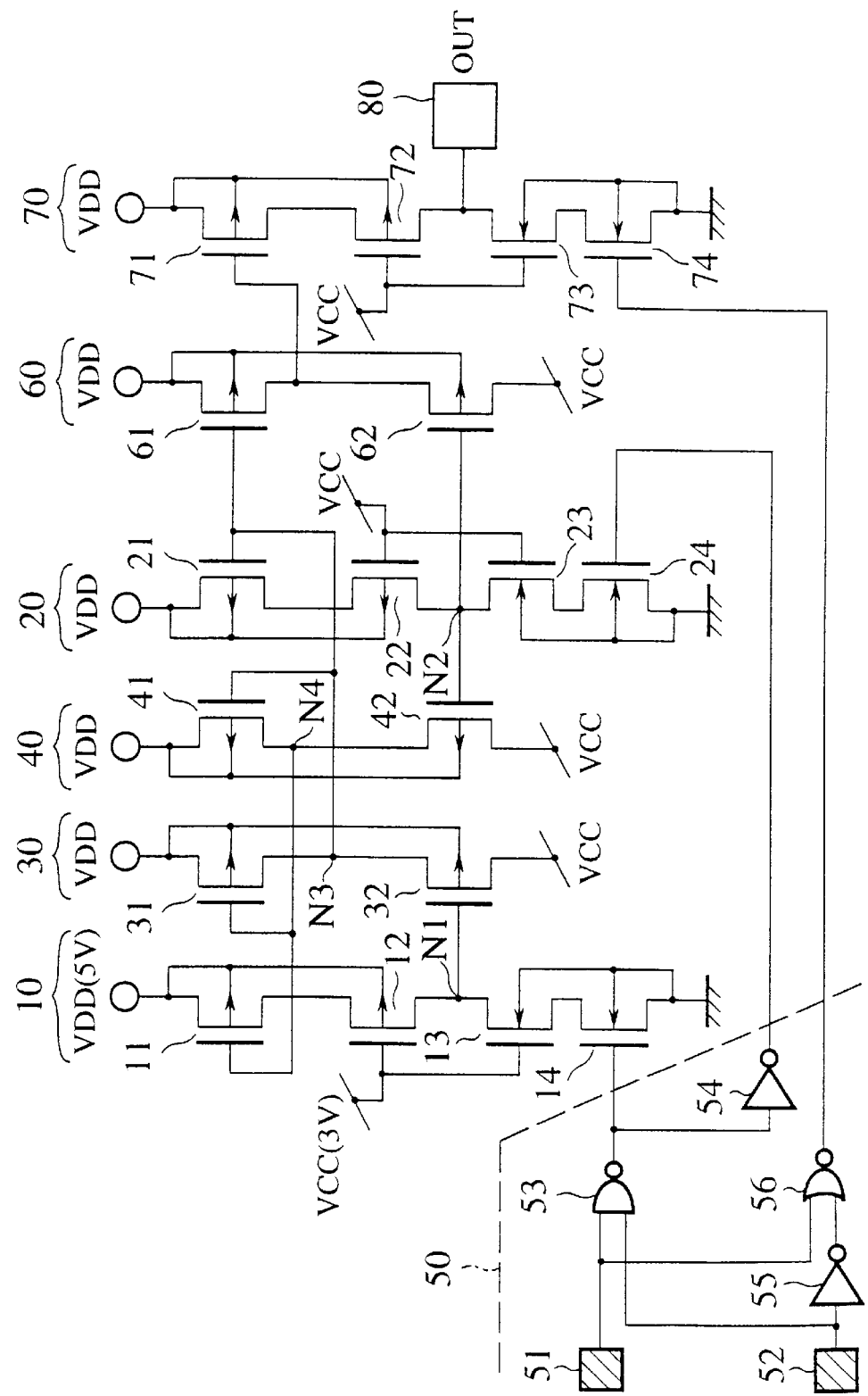
FIG. 9 is a circuit diagram showing a configuration of a semiconductor integrated circuit according to a sixth embodiment of the present invention.

FIG. 9 is a circuit diagram showing a configuration of a semiconductor integrated circuit according to a sixth embodiment of the present invention. In FIG. 9, the same parts or elements to those in FIG. 4 are denoted by the same references.

In the sixth embodiment, the level conversion circuit shown in FIG. 4 is employed as a tri-state buffer circuit of the semiconductor integrated circuit. The tri-state buffer circuit comprises a 3 V system logic circuit 50 and an output side of the logic circuit 50 is connected to the level conversion circuit having the configuration shown in FIG. 4. The 3 V system logic circuit 50 has a data terminal 51 and an enable terminal 52, and consists of a NAND gate 53, inverters 54, 55, and a NOR gate 56. In addition, a main buffer circuit 70 is connected to the output side of the level conversion circuit via a prebuffer circuit 60. The prebuffer circuit 60 is made up of P-MOSs 61, 62 and supplies a signal of an amplitude between 5 V to 3 V to a P-MOS 71. The main buffer circuit 70 is made up of P-MOSs 71, 72 and N-MOSs 73, 74, and outputs an output signal OUT to the outside of the integrated circuit via an output pad 80 connected to the output side.

In turn, an operation of the semiconductor integrated circuit will be explained hereinbelow.

At first, the case will be considered where 0 V ("0" level) is supplied to the enable terminal 52.

In this case, since an output of the NAND gate 53 is at 3 V ("1" level), inputs of the N-MOSs 14, 24 are at 3 V ("1" level) and 0 V ("0" level) respectively. Therefore, according to the first embodiment, inputs of the P-MOSs 61, 62 are at 3 V ("0" level) and 5 V ("1" level) at this time respectively. For this reason, 5 V ("1" level) is applied to the P-MOS 71. Meanwhile, 0 V ("0" level) is applied to the N-MOS 74. Consequently, the output pad 80 goes to a high impedance state finally.

Then, the case will be considered where 3 V ("1" level) is supplied to the enable terminal 52 and 3 V ("1" level) is supplied to the data terminal 51. In this case, since the output of the NAND gate 53 is at 0 V ("0" level), the inputs of the N-MOSs 14, 24 are at 0 V ("0" level) and 3 V ("1" level) respectively. Therefore, according to the first embodiment, the inputs of the P-MOSs 61, 62 are at 5 V ("1" level) and 0 V ("0" level) at this time respectively. For this reason, 3 V ("1" level) is applied to the P-MOS 71. Meanwhile, 0 V ("0" level) is applied to the N-MOS 74. Consequently, the output pad 80 is at 5 V ("1" level) finally.

Still further, the case will be considered where 3 V ("1" level) is supplied to the enable terminal 52 and 0 V ("0" level) is supplied to the data terminal 51. In this case, since the output of the NAND gate 53 is at 3 V ("1" level), the inputs of the N-MOSs 14, 24 are at 3 V ("1" level) and 0 V ("0" level) respectively. Therefore, according to the first embodiment, the inputs of the P-MOSs 61, 62 are at 3 V ("0" level) and 5 V ("1" level) at this time respectively. For this reason, 5 V ("1" level) is applied to the P-MOS 71. In the meanwhile, 3 V ("1" level) is applied to the N-MOS 74. As a result, the output pad 80 is at 0 V ("0" level) finally.

With the above results, this circuit functions as the tri-state buffer.

If the gate of the P-MOS 71 is connected to the output node N4 (OUT2) of the second intermediate circuit 40 in the level conversion circuit, the prebuffer circuit 60 can be omitted.

In the above embodiments, although the case has been explained where two power supply systems of 5 V and 3 V are employed, it is supposed that the breakdown voltage of the gate oxide film is less than 3.3 V in the 0.25 μm device generation. The present invention may be applied to such device generation by applying a combination of high voltage of 3.3 V and low voltage of 2 V.

As stated earlier in detail, according to the level conversion circuit of the first embodiment of the present invention, the level conversion circuit can be composed of only such MOS transistors that the breakdown voltage of the gate oxide film is lower than the high voltage power-supply level, and the amplitude of the signal voltage can be converted from the amplitude of the low voltage power-supply to the amplitude of the high voltage power-supply without increasing power consumption in a non-operation state. Therefore, the level conversion circuit with low power consumption can be achieved without making the manufacturing process complicated. Further, a higher speed operation than the third conventional circuit is made possible and also reduction in load driving capability can be suppressed. Furthermore, ON resistances of the MOS transistors can be adjusted by preparing low voltage power supplies connected to the MOS transistors independently as different low voltage power supplies, so that margin of dimension setting can be afforded.

If ON resistances of the MOS transistors constituting the level conversion circuit are adjusted properly, the level conversion circuit can operate precisely without malfunction.

According to the second, third, and fourth embodiments, the same or similar advantages can be achieved by the configurations which are simpler than the first embodiment.

According to the fifth embodiment, load to the gate oxide film of the fourth and sixth P-MOSs can be reduced further more.

According to the sixth embodiment, the semiconductor integrated circuit can be provided in which the above level conversion circuit capable of achieving the above advantages is incorporated.

It should be understood that many modifications and adaptations of the invention will become apparent to those skilled in the art and it is intended to encompass such obvious modifications and changes in the scope of the claims appended hereto.

What is claimed is:

1. A level conversion circuit comprising:
    a first CMOS circuit including first and second P-channel MOS transistors connected in series between a high voltage power supply for supplying a high voltage and a first output node, and first and second N-channel MOS transistors connected in series between said first output node and ground, a first signal being applied to a gate of said first P-channel MOS transistor serving as a pull-up transistor, an input signal which has an amplitude between a low voltage lower than said high voltage and a ground voltage being applied to a gate of said second N-channel MOS transistor serving as a pull-down transistor, and a low voltage being applied commonly to respective gates of said second P-channel MOS transistor and said first N-channel MOS transistor;
    a first intermediate circuit including a third P-channel MOS transistor connected between said high voltage power supply and a second output node and said first signal being applied to its gate, and a fourth P-channel MOS transistor connected between said second output node and a low voltage power supply for supplying a low voltage and potential of said first output node of said first CMOS circuit being applied to its gate;
    a second intermediate circuit including a fifth P-channel MOS transistor connected between said high voltage power supply and a third output node and potential of said second output node of said first intermediate circuit being applied to its gate, and a sixth P-channel MOS transistor connected between said third output node and said low voltage power supply and an output signal being applied to its gate, and for outputting said first signal from said third output node; and
    a second CMOS circuit including seventh and eighth P-channel MOS transistors connected in series between said high voltage power supply and a fourth output node, and third and fourth N-channel MOS transistors connected in series between said fourth output node and said ground, potential of said second output node of said first intermediate circuit being applied to a gate of said seventh P-channel MOS transistor serving as a pull-up transistor, an inverted signal of said input signal being applied to a gate of said fourth N-channel MOS transistor serving as a pull-down transistor, and said low voltage being applied commonly to respective gates of said eighth P-channel MOS transistor and said third N-channel MOS transistor, and for outputting a signal having an amplitude between said high voltage and said ground voltage from said fourth output node to an outside as said output signal.

2. A level conversion circuit according to claim 1, wherein series ON resistances of said first and second P-channel MOS transistors are set larger than series ON resistances of said first and second N-channel MOS transistors in said first CMOS circuit, and series ON resistances of said seventh and eighth P-channel MOS transistors are set larger than series ON resistances of said third and fourth N-channel MOS transistors in said second CMOS circuit, and an ON resistance of said third P-channel MOS transistor is set larger than an ON resistance of said fourth P-channel MOS transistor in said first intermediate circuit, and an ON resistance of said fifth P-channel MOS transistor is set larger than an ON resistance of said sixth P-channel MOS transistor in said second intermediate circuit.

3. A level conversion circuit comprising:
    a first CMOS circuit including first and second P-channel MOS transistors connected in series between a high voltage power supply for supplying a high voltage and a first output node, and first and second N-channel MOS transistors connected in series between said first output node and ground, a first signal being applied to a gate of said first P-channel MOS transistor serving as a pull-up transistor, an input signal which has an amplitude between a low voltage lower than said high voltage and a ground voltage being applied to an input node connected to a gate of said second N-channel MOS transistor serving as a pull-down transistor, and a low voltage being applied commonly to respective gates of said second P-channel MOS transistor and said first N-channel MOS transistor;
    a first intermediate circuit including a third P-channel MOS transistor connected between said high voltage power supply and a second output node and said first signal being applied to its gate, and a fourth P-channel MOS transistor connected between said second output node and a low voltage power supply for supplying a low voltage and potential of said first output node of said first CMOS circuit being applied to its gate;
    a second intermediate circuit including a fifth P-channel MOS transistor connected between said high voltage power supply and a third output node and potential of said second output node of said first intermediate circuit being applied to its gate, and a sixth P-channel MOS transistor connected between said third output node and said low voltage power supply and an output signal being applied to its gate, and for outputting said first signal from said third output node; and
    a second CMOS circuit including seventh and eighth P-channel MOS transistors connected in series between said high voltage power supply and a fourth output node, and a third N-channel MOS transistor connected between said fourth output node and said input node, potential of said second output node of said first intermediate circuit being applied to a gate of said seventh P-channel MOS transistor serving as a pull-up transistor, and said low voltage being applied commonly to respective gates of said eighth P-channel MOS transistor and said third N-channel MOS transistor serving as a pull-down transistor, and for outputting a signal having an amplitude between said high voltage and said ground voltage from said fourth output node to an outside as said output signal.

4. A level conversion circuit comprising:
    a first CMOS circuit including first and second P-channel MOS transistors connected in series between a high voltage power supply for supplying a high voltage and a first output node, and a first N-channel MOS transistor connected between said first output node and an input node, a first signal being applied to a gate of said first P-channel MOS transistor serving as a pull-up transistor, an input signal which has an amplitude between a low voltage lower than said high voltage and a ground voltage being applied to said input node which is connected to a source of said first N-channel MOS transistor serving as a pull-down transistor, and a low voltage being applied commonly to respective gates of said second P-channel MOS transistor and said first N-channel MOS transistor;

a first intermediate circuit including a third P-channel MOS transistor connected between said high voltage power supply and a second output node and said first signal being applied to its gate, and a fourth P-channel MOS transistor connected between said second output node and a low voltage power supply for supplying a low voltage and potential of said first output node of said first CMOS circuit being applied to its gate;

a second intermediate circuit including a fifth P-channel MOS transistor connected between said high voltage power supply and a third output node and potential of said second output node of said first intermediate circuit being applied to its gate, and a sixth P-channel MOS transistor connected between said third output node and said low voltage power supply and an output signal being applied to its gate, and for outputting said first signal from said third output node; and a second CMOS circuit including seventh and eighth P-channel MOS transistors connected in series between said high voltage power supply and a fourth output node, and second and third N-channel MOS transistors connected in series between said fourth output node and said ground, potential of said second output node of said first intermediate circuit being applied to a gate of said seventh P-channel MOS transistor serving as a pull-up transistor, said input signal being applied to a gate of said third N-channel MOS transistor serving as a pull-down transistor, and said low voltage being applied commonly to respective gates of said eighth P-channel MOS transistor and said second N-channel MOS transistor, and for outputting a signal having an amplitude between said high voltage and said ground voltage from said fourth output node to an outside as said output signal.

5. A level conversion circuit comprising:

a first CMOS circuit including first and second P-channel MOS transistors connected in series between a high voltage power supply for supplying a high voltage and a first output node, and a first N-channel MOS transistor connected between said first output node and a first input node, a first signal being applied to a gate of said first P-channel MOS transistor serving as a pull-up transistor, an input signal which has an amplitude between a low voltage lower than said high voltage and a ground voltage being applied to said first input node connected to a source of said first N-channel MOS transistor serving as a pull-down transistor, and a low voltage being applied commonly to respective gates of said second P-channel MOS transistor and said first N-channel MOS transistor;

a first intermediate circuit including a third P-channel MOS transistor connected between said high voltage power supply and a second output node and said first signal being applied to its gate, and a fourth P-channel MOS transistor connected between said second output node and a low voltage power supply for supplying a low voltage and potential of said first output node of said first CMOS circuit being applied to its gate;

a second intermediate circuit including a fifth P-channel MOS transistor connected between said high voltage power supply and a third output node and potential of said second output node of said first intermediate circuit being applied to its gate, and a sixth P-channel MOS transistor connected between said third output node and said low voltage power supply and an output signal being applied to its gate, and for outputting said first signal from said third output node; and a second CMOS circuit including seventh and eighth P-channel MOS transistors connected in series between said high voltage power supply and a fourth output node, and a second N-channel MOS transistor connected between said fourth output node and said second input node, potential of said second output node of said first intermediate circuit being applied to a gate of said seventh P-channel MOS transistor serving as a pull-up transistor, an inverted signal of said input signal being applied to said second input node connected to a source of said second N-channel MOS transistor serving as a pull-down transistor, and said low voltage being applied commonly to respective gates of said eighth P-channel MOS transistor and said second N-channel MOS transistor, and for outputting a signal having an amplitude between said high voltage and said ground voltage from said fourth output node to an outside as said output signal.

6. A level conversion circuit according to claim 1, wherein said first signal is a signal having an amplitude between said high voltage and said low voltage, and said first signal is output to said outside.

7. A level conversion circuit according to claim 2, wherein said first signal is a signal having an amplitude between said high voltage and said low voltage, and said first signal is output to said outside.

8. A level conversion circuit according to claim 3, wherein said first signal is a signal having an amplitude between said high voltage and said low voltage, and said first signal is output to said outside.

9. A level conversion circuit according to claim 4, wherein said first signal is a signal having an amplitude between said high voltage and said low voltage, and said first signal is output to said outside.

10. A level conversion circuit according to claim 5, wherein said first signal is a signal having an amplitude between said high voltage and said low voltage, and said first signal is output to said outside.

11. A level conversion circuit according to claim 1, wherein substrates of said fourth and sixth P-channel MOS transistors are connected to respective source sides so as to be isolated from substrates of other P-channel MOS transistors.

12. A level conversion circuit according to claim 2, wherein substrates of said fourth and sixth P-channel MOS transistors are connected to respective source sides so as to be isolated from substrates of other P-channel MOS transistors.

13. A level conversion circuit according to claim 3, wherein substrates of said fourth and sixth P-channel MOS transistors are connected to respective source sides so as to be isolated from substrates of other P-channel MOS transistors.

14. A level conversion circuit according to claim 4, wherein substrates of said fourth and sixth P-channel MOS transistors are connected to respective source sides so as to be isolated from substrates of other P-channel MOS transistors.

15. A level conversion circuit according to claim 5, wherein substrates of said fourth and sixth P-channel MOS transistors are connected to respective source sides so as to be isolated from substrates of other P-channel MOS transistors.

16. A semiconductor integrated circuit comprising:

a low voltage power supply circuit connected between a low voltage power supply for supplying a low voltage and ground, for outputting a first signal having an amplitude between said low voltage and a ground voltage; and a level conversion circuit for level-converting said first signal output from said low voltage power supply circuit into a second signal having an amplitude between a high voltage higher than said low voltage and said ground voltage; and wherein said level conversion circuit is made up of a level conversion circuit set forth in claim 1.

17. A semiconductor integrated circuit comprising:

a low voltage power supply circuit connected between a low voltage power supply for supplying a low voltage and ground, for outputting a first signal having an amplitude between said low voltage and a ground voltage; and a level conversion circuit for level-converting said first signal output from said low voltage power supply circuit into a second signal having an amplitude between a high voltage higher than said low voltage and said ground voltage; and wherein said level conversion circuit is made up of a level conversion circuit set forth in claim 2.

18. A semiconductor integrated circuit comprising:

a low voltage power supply circuit connected between a low voltage power supply for supplying a low voltage and ground, for outputting a first signal having an amplitude between said low voltage and a ground voltage; and a level conversion circuit for level-converting said first signal output from said low voltage power supply circuit into a second signal having an amplitude between a high voltage higher than said low voltage and said ground voltage; and wherein said level conversion circuit is made up of a level conversion circuit set forth in claim 3.

19. A semiconductor integrated circuit comprising:

a low voltage power supply circuit connected between a low voltage power supply for supplying a low voltage and ground, for outputting a first signal having an amplitude between said low voltage and a ground voltage; and a level conversion circuit for level-converting said first signal output from said low voltage power supply circuit into a second signal having an amplitude between a high voltage higher than said low voltage and said ground voltage; and wherein said level conversion circuit is made up of a level conversion circuit set forth in claim 4.

20. A semiconductor integrated circuit comprising:

a low voltage power supply circuit connected between a low voltage power supply for supplying a low voltage and ground, for outputting a first signal having an amplitude between said low voltage and a ground voltage; and a level conversion circuit for level-converting said first signal output from said low voltage power supply circuit into a second signal having an amplitude between a high voltage higher than said low voltage and said ground voltage; and wherein said level conversion circuit is made up of a level conversion circuit set forth in claim 5.

* * * * *